United States Patent [19]

Kertis et al.

[11] Patent Number: 4,980,792

[45] Date of Patent: Dec. 25, 1990

[54] BICMOS POWER TRANSITION CIRCUIT

[75] Inventors: Robert A. Kertis; Douglas D. Smith, both of Puyallup; Terrance L. Bowman, Sumner, all of Wash.

[73] Assignee: National Semiconductor Corporation, Santa Clara, Calif.

[21] Appl. No.: 151,346

[22] Filed: Feb. 2, 1988

[51] Int. Cl.$^5$ .............................................. H02H 3/20
[52] U.S. Cl. ....................................... 361/91; 361/88; 361/111; 365/228
[58] Field of Search ....................... 361/91, 92, 18, 88, 361/86, 90, 111, 56; 364/184, 185; 340/663, 654, 660, 661; 307/296 R, 200 A, 350, 362, 85, 86, 87, 64, 66, 130, 68, 363, 364; 365/226, 228, 229; 357/40

[56] References Cited

U.S. PATENT DOCUMENTS

| 4,086,503 | 4/1978 | Fox et al. ............................ 307/363 |
| 4,096,560 | 6/1978 | Footh ................................... 364/200 |
| 4,160,176 | 7/1979 | Takahashi ........................... 307/362 |
| 4,375,663 | 3/1983 | Arcara et al. ....................... 364/200 |
| 4,429,236 | 1/1984 | Nitschke ............................. 307/362 |
| 4,594,517 | 6/1986 | Cohen et al. ..................... 307/296 R |
| 4,685,023 | 8/1987 | Heaston ............................... 361/88 |
| 4,749,880 | 6/1988 | Kobatake ............................ 307/362 |

OTHER PUBLICATIONS

Sedra, Adel S. and Kenneth C. Smith, *Microelectronic Circuits*, 1982, pp. 694–697;
Holt, Rinehart and Winston, New York, pp. 269–273.

Primary Examiner—A. D. Pellinen
Assistant Examiner—David Osborn
Attorney, Agent, or Firm—Townsend and Townsend

[57] ABSTRACT

A power transition circuit protects a bipolar-CMOS (BiCMOS) circuit during power transitions. Reference signals proportional to the voltage supplied to the protected circuit are monitored, and the power transition circuit determines from the voltage differential between the reference signals whether a power transition is occurring. If a transition is present, the transition circuit disables the protected BiCMOS circuit for as long as the power transition exists. An independent input signal allows the power transition circuit to disable the protected BiCMOS circuit in response to other conditions.

10 Claims, 2 Drawing Sheets

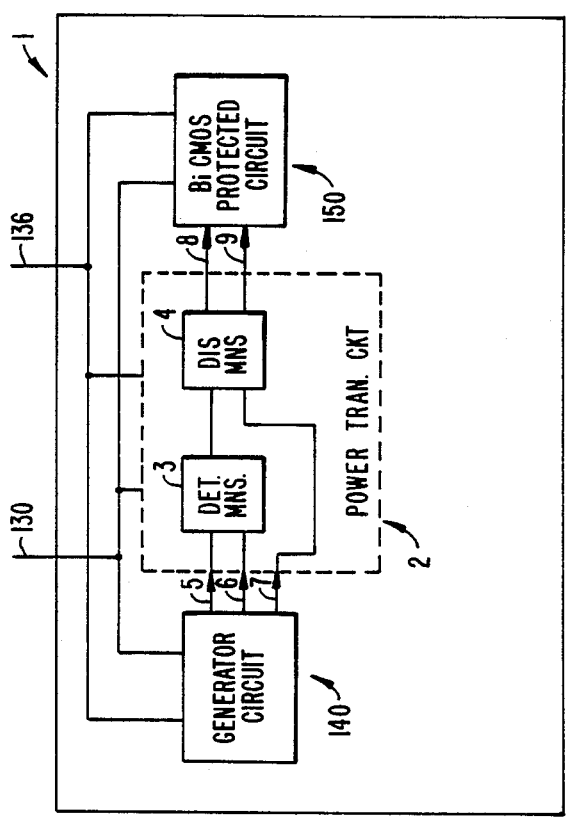
FIG._1.

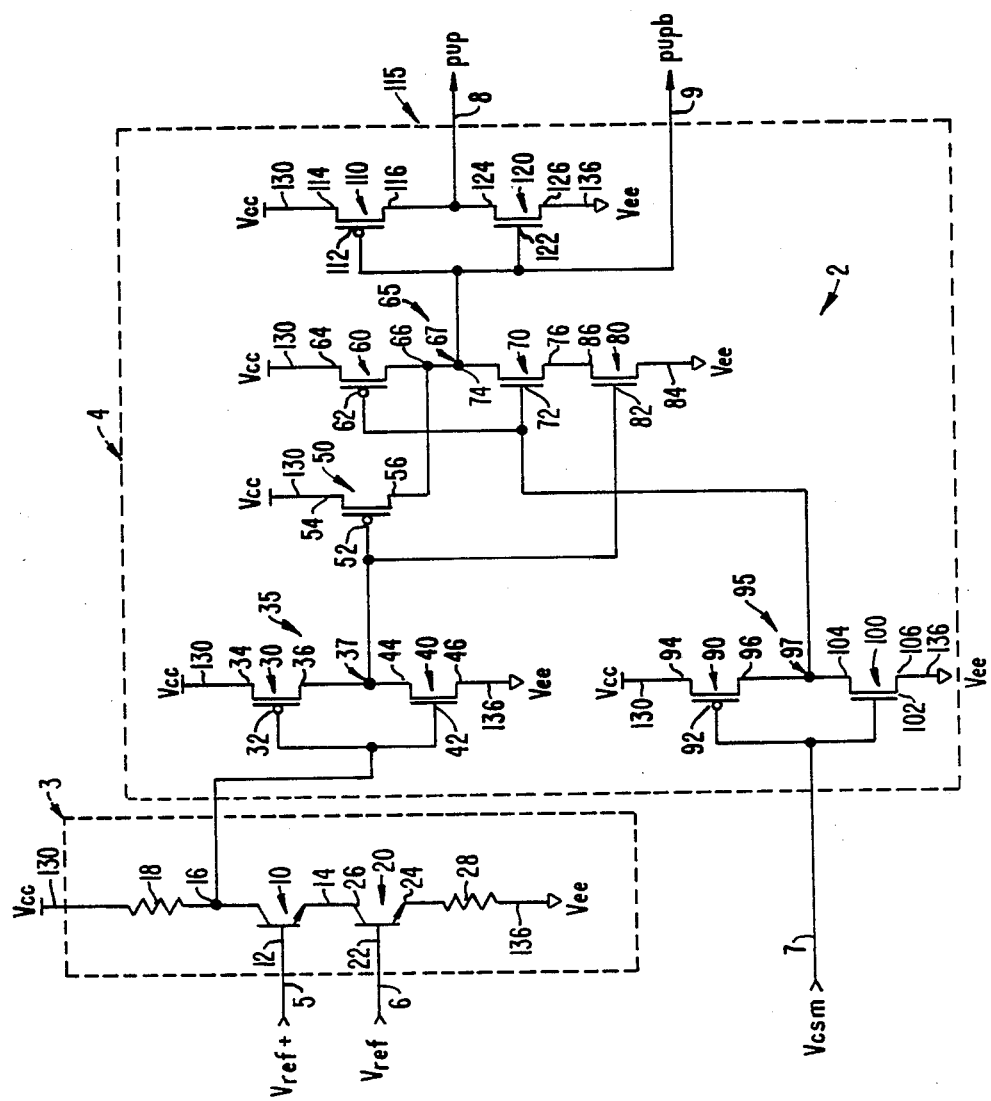
FIG._2.

BICMOS POWER TRANSITION CIRCUIT

BACKGROUND OF THE INVENTION

1. Field of the Invention

This invention relates to electronic circuitry, and more particularly to circuitry for protecting bipolar-complementary metal oxide semiconductor (BiCMOS) circuits during power transitions.

2. Description of the Prior Art

Many circuits require protection during power transitions, that is, during the short time interval while power is being turned on or off. Circuits having both bipolar and MOS devices particularly require protection because the bipolar devices and the MOS devices have different characteristics during power transitions. For example, data in a BiCMOS static RAM is stored in a plurality of flip-flops which are individually selected for reading or writing information. In such circuits, the voltage levels present during a power transition may be sufficient to turn-on the CMOS transistors, but leave the bipolar transistors in the circuit essentially off. The output levels of the substantially off bipolar transistors appear to the remainder of the circuit as legitimately "high". The unintended high outputs may cause the CMOS devices in the circuit to enter undefined states. In a BiCMOS memory device, these undefined states can cause data loss or multiple selects with resultant high current and potential damage to the BiCMOS chip.

SUMMARY OF THE INVENTION

With the present invention, power transitions in a BiCMOS circuit are detected by monitoring the voltage difference supplied to the bipolar transistors to determine whether a power transition is present. Because CMOS devices are active at lower voltage levels than the bipolar transistors, once the bipolar transistors are active, all of the semiconductors in the BiCMOS circuit will be active. It is only necessary, therefore, to disable or protect the BiCMOS circuit until the bipolar transistors are active.

A BiCMOS protection circuit according to the present invention is constructed on the same chip as the BiCMOS circuit which is being protected. The present invention provides a circuit which generates a first reference input signal proportional to the upper power supply in the protected circuit and a second reference input signal proportional to the lower power supply in the protected circuit. The protection circuit determines from the first and second reference input signals whether a power transition is occurring. If a transition is occurring, the protection circuit supplies an output that disables memory row decoders and write logic in the BiCMOS memory circuit. In addition, the present invention allows an independent input signal to override a determination that no power transition exists, and nonetheless protect the BiCMOS circuit.

The present invention provides automatic protection without operator intervention. When power to the BiCMOS circuit is in transition, or when the independent signal is present, the output signal from the power transition circuit protects the BiCMOS circuit. When power transition has passed, and when the independent input signal permits, the BiCMOS circuit automatically resumes normal operation.

BRIEF DESCRIPTION OF THE DRAWINGS

FIG. 1 is a block diagram of a power transition circuit shown connected to protect a BiCMOS circuit.

FIG. 2 is a circuit schematic of the power transition circuit.

DETAILED DESCRIPTION OF THE PREFERRED EMBODIMENTS

FIG. 1 shows a semiconductor die 1 that includes a BiCMOS circuit 150 to be protected, a generator circuit 140 and a power transition circuit 2. Die 1 receives upper power supply voltage Vcc on line 130 and lower power supply voltage Vee on line 136. Power transition circuit 2 protects circuit 150 during power transitions. Circuit 2 includes a monitoring circuit 3 and a disabling circuit 4. Generator circuit 140 provides input signals on lines 5, 6 to the monitoring circuit 3, and a third input signal on line 7 to the disabling circuit 4. From the two input signals on lines 5 and 6, the monitoring circuit 3 determines whether a power transition is occurring and therefore whether to disable BiCMOS circuit 150. If disabling is required, then circuit 4 causes output signal Pup on line 8 to be "0", otherwise Pup is "1". The third input signal on line 7 is connected directly to the disabling circuit and causes output signal Pup to be "0" whenever the third signal is present.

In the preferred embodiment, protected circuit 150 is a BiCMOS SRAM. When output Pup on line 8 is "0", circuitry within BiCMOS SRAM 150 disables the SRAM memory row decoders (not shown) and write logic functions (not shown). A complementary output signal Pupb is supplied on line 9 to protected BiCMOS circuit 150.

Generator 140 provides two signals to determining circuit 3—first reference Vref+ on line 5 and second reference Vref on line 6. An independent input signal Vcsm on line 7 is supplied directly to disabling circuit 4. Signal Vref+ is proportional to the upper power supply Vcc on line 130, while signal Vref is proportional to lower power supply Vee on line 136. Determining circuit 3 relies upon the difference in potential between Vref and Vref+ in deciding whether power to BiCMOS circuit 150 is in transition. Signal Vcsm is any signal whose presence the system designer wishes to cause protection of BiCMOS circuit 150.

First and second reference input signals Vref+ and Vref are obtained from a generator such as that disclosed in application Ser. No. 07/151,348 filed Feb. 2, 1988, entitled "BiCMOS Voltage Reference Generator," and commonly assigned. In that application, Vref is the reference voltage, approximately 1.25 volts more positive than lower power supply Vee. Vref+ is obtained by connecting an emitter follower to emitter 84 of transistor 80, and is approximately 1 volt less than upper power supply Vcc. Input Vcsm is supplied from a generator such as that disclosed in application Ser. No. 07/151,347, filed Feb. 2, 1988, entitled "Low Power Bipolar-CMOS Interface Circuit," also commonly assigned.

In BiCMOS circuits which include emitter coupled logic (ECL) circuits, the bipolar transistors are active when Vref+ is 0.3 volts more positive than Vref. Thus, to detect a transition it is only necessary to determine when (Vref+ < Vref+0.3) volts. In this case, determining circuit 3 causes disabling circuit 4 to make output Pup on line 8 to be "0", thus disabling circuit 150. Of course, while 0.3 volts difference is satisfactory for ECL, different values will be employed to protect TTL or other bipolar configurations.

FIG. 2 is a detailed schematic of the power transition circuit 2. Circuit 2 includes the determining circuit 3 and the disabling circuit 4. Determining circuit 3 receives signal Vref+ on line 5 and signal Vref on line 6. Signal Vref+ on line 5 is connected to base 12 of bipolar transistor 10, and signal Vref on line 6 is connected to base 22 of bipolar transistor 20. Collector 26 of transistor 20 is connected to emitter 14 of transistor 10, thereby placing transistor 20 in series with transistor 10.

When the power supplies Vcc and Vee are turned on, signal Vref on line 6 will reach a level sufficient to turn on transistor 20 before signal Vref+ on line 5 reaches a level sufficient to turn on transistor 10. When transistor 20 turns on, current from emitter 24 flows into resistor 28, and transistor 20 will try to saturate. The voltage at emitter 24 will be approximately (Vref−0.7) volts, and the voltage at collector 26 will be approximately 0.3 volts (one collector-emitter voltage drop) more positive than the voltage at emitter 24. Therefore, the voltage at emitter 14 is approximately (Vref−0.7+0.3) volts or (Vref−0.4) volts. For transistor 10 to become active, the voltage at base 12, Vref+, must exceed the voltage at emitter 14 by at least 0.7 volts. Therefore, transistor 10 turns on only when Vref+>0.7+(Vref−0.4) volts, or when Vref+>Vref+0.3 volts. The condition Vref+≧Vref+0.3 volts is referred to herein as the "proper" Vref+, Vref relationship.

Because transistors 10 and 20 are in series, no current flows through resistor 18 until both transistors 10 and 20 are on. Current flow through resistor 18 therefore signifies no power transition, i.e., Vref+≧Vref+0.3 volts. Transistors 10 and 20 thus provide a NAND function on input signals Vref+ and Vref. The voltage at collector 16 is relatively low when the proper Vref+, Vref relationship exists, and is relatively high when the relationship does not exist.

Collector 16 is connected to the gates 32, 42 of PMOS transistor 30 and NMOS transistor 40 in the disabling circuit The output of the inverter 35 formed by transistors 30 and 40 is node 37. When the Vref+, Vref relationship is proper, node 37 is at a CMOS "1" level. The signal at node 37 is thus analogous to an AND function of Vref+ and Vref.

Node 37 is connected to gate 52 of PMOS transistor 50 and to gate 82 of NMOS transistor 80. Transistor 50 is connected as an inverter, with source 54 tied to power supply Vcc on line 130 and with drain 56 tied to drains 66, 74 of transistors 60 and 70. When node 37 is "1", transistor 80 is turned on and allows transistor 60 and 70 to function. Transistors 60 and 70 are respectively PMOS and NMOS devices whose respective gates 62, 72 and drains 66, 74 are tied together to create another inverter 65.

Transistors 90 and 100 have their respective gates 92, 102 and drains 96, 104 tied together to form another inverter 95. Signal Vcsm on line 7 is connected to the inverter 95. Vcsm is a user specified signal employed to disable BiCMOS circuit 150 when Vcsm is a "1", i.e., when the output signal at node 97 is a "0".

The circuit shown in FIG. 2 operates as follows. If a power transition is occurring and the user specified enable signal Vcsm is active, node 16 will be low and input signal Vcsm will be high. Thus, node 37 will be high and node 97 low. Thus, nodes 62, 72 of inverter 65 are "0" and the output of inverter 65 at node 67 is "1". Because gate 52 of transistor 50 is "high" and source 54 is "high", transistor 50 is off, and does not affect the output of inverter 65 at node 67 which maintains a "1". Inverter 115 inverts the output of inverter 65 at node 67. Therefore, the output of inverter 115, output Pup on line 8, is a "0", disabling the protected circuit.

Next, assume that input Vcsm on line 7 is "0" (i.e., no disable required), but that the Vref+, Vref relationship is not proper. The improper Vref+, Vref relationship places a "0" at node 37. Transistor 80 is turned off and renders inverter 65 inoperative. Vcsm is "0" and the output of inverter 95 at node 97 is "1". The "1" output from inverter 95 does not change the output of inverter 65 at node 67 because transistor 80 is off. Thus, Vcsm will not affect the output signal from inverter 65. The "0" output from inverter 35 turns transistor 50 on, pulling the output of inverter 65 at node 67 up to "1". Because drain 66 of transistor 60 is tied to the output of inverter 65 at node 67, node 67 is pulled up to a "1". Therefore, the output of inverter 115, Pup on line 8, will be a "0", protecting BiCMOS circuit 150.

Under normal conditions, input Vcsm is "0", and the Vref+, Vref relationship is proper. Thus, the output of inverter 35 at node 37 will be a "1", turning on transistor 80. The output of inverter 95 at node 97 also will be a "1". Because gate 52 and source 54 are both "high", transistor 50 is turned off and does not disturb output 67 of inverter 65. Under these conditions, output Pup on line 8 is a "1", allowing BiCMOS circuit 150 to function normally.

The foregoing description has included many details to explain the operation and implementation of the circuit. It will be apparent that variations may be made to the disclosed embodiment without departing from the scope of the invention as defined in the following claims. For example, fewer or more inputs may be monitored to determine whether the protected circuit should be disabled. In addition, the disable signal may be used to protect the entire BiCMOS or other circuits, or merely those portions susceptible to damage during power transition. Those skilled in the art will appreciate that circuits other than BiCMOS or BiCMOS SRAMs may be protected using the present invention, or that other input signals may be provided to the present invention to allow for protection under additional conditions.

We claim:

1. A protection circuit for protecting a first circuit during power transitions, the first circuit being driven by a potential difference and fabricated with semiconductors having different characteristics at low voltage, comprising:

monitoring circuit means for monitoring the potential difference and generating a first signal when the difference exceeds a predetermined value, said monitoring means further comprising a first transistor connected in series with a second transistor, the first transistor having a control electrode connected to receive an upper voltage, the second transistor having a control electrode connected to receive a lower voltage, a first resistor serially connected between the second transistor and a lower potential source, and an upper potential source connected to the first transistor, the potential difference being between the upper and lower voltages;

disabling circuit means coupled to the monitoring circuit means, for disabling the first circuit when the first signal is not present, whereby the first circuit is disabled during power transitions, said disabling means further comprising a first inverter connected to receive the first signal from the monitoring circuit and a second inverter connected to receive a second signal.

2. A circuit as in claim 1 wherein the first circuit comprises a BiCMOS circuit.

3. A protection circuit for protecting a first circuit during power transitions, the first circuit being driven by a DC potential difference and fabricated with semiconductors having different characteristics at low voltage, comprising:
   (a) monitoring circuit means for monitoring the potential difference and generating a first signal when the DC difference exceeds a predetermined value, the monitoring means comprising:
      (i) a first transistor connected in series with a second transistor, the first transistor having a control electrode connected to receive an upper voltage, the second transistor having a control electrode connected to receive a lower voltage, the DC potential difference being a difference between the upper and lower voltage;
      (ii) a first resistor serially connected between the second transistor and a lower potential source; and
      (iii) an upper potential source connected to the first transistor; and
   (b) disabling circuit means coupled to the monitoring circuit means, for disabling the first circuit when the first signal is not present, whereby the first circuit is disabled during power transitions, the disabling circuit means comprising:
      (i) a first inverter connected to receive the first signal from the monitoring circuit;
      (ii) a second inverter connected to receive a second signal; and
      (iii) a third inverter connected to receive a second inverter output signal from the second inverter.

4. A protection circuit for protecting a first circuit during power transitions, the first circuit being driven by a DC potential difference and fabricated with semiconductors having different characteristics at low voltage, comprising:
   (a) monitoring circuit means for monitoring the DC potential difference and generating a first signal when the difference exceeds a predetermined value, the monitoring means comprising:
      (i) a first transistor connected in series with a second transistor, the first transistor having a control electrode connected to receive an upper voltage, the second transistor having a control electrode connected to receive a lower voltage, the DC potential difference being a difference between the upper and lower voltage;
      (ii) a first resistor serially connected between the second transistor and a lower potential source; and
      (iii) an upper potential source connected to the first transistor; and
   (b) disabling circuit means coupled to the monitoring circuit means, for disabling the first circuit when the first signal is not present, whereby the first circuit is disabled during power transitions, the disabling circuit means comprising:
      (i) a first inverter connected to receive the first signal from the monitoring circuit;
      (ii) a second inverter connected to receive a second signal; and
      (iii) a third inverter connected to receive a second inverter output signal from the second inverter,
   (c) a first control transistor connected to receive the upper voltage, connected to the first inverter, and connected to a third inverter output node.

5. A circuit as in claim 4 further comprising:
   a second control transistor connected between the third inverter and the lower voltage and to the first inverter.

6. A protection circuit for protecting a first circuit during power transitions, the first circuit being driven by a first DC potential difference and fabricated with semiconductors having different characteristics at low voltage, comprising:
   generating circuit means for generating a second DC potential difference proportional to the first potential difference;
   monitoring circuit means for monitoring the second DC potential difference and generating a first signal when the second DC potential difference exceeds a predetermined value, said monitoring means further comprising a first transistor connected in series with a second transistor, the first transistor having a control electrode connected to receive an upper voltage, the second transistor having a control electrode connected to receive a lower voltage, a first resistor serially connected between the second transistor and a lower potential source, and an upper DC potential source connected to the first transistor, the second DC potential difference being a difference between the upper and lower voltages;
   disabling circuit means coupled to the monitoring circuit means, for disabling the first circuit when the first signal is not present, whereby the first circuit is disabled during power transitions, the disabling circuit means further comprising a first inverter connected to receive the first signal from the monitoring circuit and a second inverter connected to receive a second signal.

7. A circuit as in claim 6 wherein the first circuit comprises a BICMOS circuit.

8. A protection circuit for protecting a first circuit during power transitions, the first circuit being driven by a first DC potential difference and fabricated with semiconductors having different characteristics at low voltage, comprising:
   (a) generating circuit means for generating a second DC potential difference proportional to the first DC potential difference;
   (b) monitoring circuit means for monitoring the second DC potential difference and generating a first signal when the difference exceeds a predetermined value, the monitoring means comprising:
      (i) a first transistor connected in series with a second transistor, the first transistor having a control electrode connected to receive an upper voltage, the second transistor having a control electrode connected to receive a lower voltage, the DC potential difference being a difference between the upper and lower voltages;
      (ii) a first resistor serially connected between the second transistor and a lower potential source; and
      (iii) an upper potential source connected to the first transistor; and (c) disabling circuit means coupled to the monitoring circuit means, for disabling the first circuit when the first signal is not present, whereby the first circuit is disabled during power transitions, the disabling circuit means comprising:
  (i) a first inverter connected to receive the first signal from the monitoring circuit;
  (ii) a second inverter connected to receive a second signal; and
  (iii) a third inverter connected to receive a second inverter output signal from the second inverter.

9. A circuit as in claim 8 further comprising a first control transistor connected to receive the upper voltage, connected to the first inverter, and connected to a third inverter output node.

10. A circuit as in claim 9 further comprising a second control transistor connected between the third inverter and the lower voltage and to the first inverter.

* * * * *